United States Patent
Schillinger et al.

(10) Patent No.: US 9,796,348 B2
(45) Date of Patent: Oct. 24, 2017

(54) CIRCUIT FOR CONDUCTING AN ELECTRIC CURRENT

(75) Inventors: Jakob Schillinger, Gaimersheim (DE);
Dietmar Huber, Rödermark (DE);
Klaus Rink, Rodenbach (DE);
Wolfgang Jöckel, Gersfeld (DE);
Martin Haverkamp, Frankfurt (DE)

(73) Assignee: Continental Teves AG & Co. oHG, Frankfurt (DE)

( * ) Notice: Subject to any disclaimer, the term of this patent is extended or adjusted under 35 U.S.C. 154(b) by 855 days.

(21) Appl. No.: 14/234,702

(22) PCT Filed: Jul. 26, 2012

(86) PCT No.: PCT/EP2012/064709
§ 371 (c)(1),
(2), (4) Date: May 2, 2014

(87) PCT Pub. No.: WO2013/014240
PCT Pub. Date: Jan. 31, 2013

(65) Prior Publication Data
US 2014/0239711 A1    Aug. 28, 2014

(30) Foreign Application Priority Data

Jul. 28, 2011   (DE) .................. 10 2011 079 966

(51) Int. Cl.
*B60L 1/00* (2006.01)
*B60L 3/00* (2006.01)
(Continued)

(52) U.S. Cl.
CPC ........ *B60R 16/033* (2013.01); *G01R 31/3606* (2013.01); *G01R 31/3696* (2013.01);
(Continued)

(58) Field of Classification Search
CPC .................. H01R 2201/26; H01R 13/00; B60R 16/0238; H02G 3/00; H02G 3/10
(Continued)

(56) References Cited

U.S. PATENT DOCUMENTS 6,034,521 A    3/2000   Eckardt
6,304,062 B1   10/2001  Batson
(Continued)

FOREIGN PATENT DOCUMENTS

DE    195 10 662    10/1996
DE    197 36 025    3/1999
(Continued)

OTHER PUBLICATIONS

German Search Report corresponding to DE 10 2012 213 183.3 dated Apr. 18, 2013.
(Continued)

*Primary Examiner* — Rexford Barnie
*Assistant Examiner* — Jagdeep Dhillon
(74) *Attorney, Agent, or Firm* — RatnerPrestia

(57) ABSTRACT

The invention relates to a circuit for conducting an electric current, by an electrical component, between a vehicle battery and an electrical network component that can be connected to the vehicle battery. The circuit includes a first electrical line segment and a second line segment that is separated from the first line segment by a spacer. The line segments are connected to one another by the electrical component.

9 Claims, 4 Drawing Sheets

(51) Int. Cl.
  *H02G 3/00* (2006.01)
  *B60R 16/033* (2006.01)
  *G01R 31/36* (2006.01)
  *H05K 13/00* (2006.01)
  *H02G 3/18* (2006.01)
  *G01R 1/20* (2006.01)

(52) U.S. Cl.
  CPC .............. *H05K 13/00* (2013.01); *G01R 1/203* (2013.01); *H02G 3/18* (2013.01); *Y10T 29/49117* (2015.01)

(58) Field of Classification Search
  USPC ................. 307/9.1, 10.1, 66, 43, 80, 64, 82; 348/143, 373; 439/76.2, 559
  See application file for complete search history.

(56) References Cited

U.S. PATENT DOCUMENTS

| | | | |
|---|---|---|---|
| 6,700,620 B1* | 3/2004 | Arnold ............. | G08B 13/19619 348/373 |
| 8,053,669 B1* | 11/2011 | Sodini ................ | B60R 16/0238 174/59 |
| 2002/0067077 A1* | 6/2002 | Hentschel ........... | B60R 16/0207 307/10.1 |
| 2005/0220932 A1* | 10/2005 | van der Eerden ... | A22C 7/0069 426/1 |
| 2006/0057899 A1 | 3/2006 | Tokunaga | |
| 2007/0037317 A1* | 2/2007 | Offterdinger ........... | H01L 21/52 438/106 |
| 2008/0020540 A1* | 1/2008 | Takeda .............. | H01L 21/76811 438/393 |
| 2008/0030208 A1 | 2/2008 | Aratani | |
| 2008/0238431 A1 | 10/2008 | Schimmel | |
| 2008/0303125 A1* | 12/2008 | Chen ..................... | H01L 23/495 257/676 |
| 2009/0174522 A1 | 7/2009 | Schulz et al. | |
| 2010/0316901 A1 | 12/2010 | Matsushima et al. | |
| 2011/0016981 A1* | 1/2011 | Gebauer ............. | G01L 19/0084 73/753 |
| 2011/0062945 A1 | 3/2011 | Condamin et al. | |
| 2013/0214804 A1 | 8/2013 | Dietz et al. | |

FOREIGN PATENT DOCUMENTS

| | | |
|---|---|---|
| DE | 10 153 273 | 5/2003 |
| DE | 10 2004 007 851 | 9/2005 |
| DE | 10 2005 043 320 | 3/2006 |
| DE | 10 2009 045 310 | 4/2011 |
| DE | 10 2011 078 548 | 1/2012 |
| FR | 2 879 751 | 3/2011 |
| JP | 2009-236641 | 10/2009 |

OTHER PUBLICATIONS

International Search Report corresponding to PCT/EP2012/064709 dated Nov. 26, 2012.
Written Opinion corresponding to PCT/EP2012/064709.

* cited by examiner

CIRCUIT FOR CONDUCTING AN ELECTRIC CURRENT

CROSS REFERENCE TO RELATED APPLICATIONS

This application is the U.S. National Phase Application of PCT International Application No. PCT/EP2012/064709, filed Jul. 26, 2012, which claims priority to German Patent Application No. 10 2011 079 966.4, filed Jul. 28, 2011, the contents of such applications being incorporated by reference herein.

FIELD OF THE INVENTION

The invention relates to a circuit for conducting an electric current between a vehicle battery and an electrical network component which can be connected to the vehicle battery via an electrical element and a vehicle having the circuit.

BACKGROUND OF THE INVENTION

In order to implement measurements of an electric current output to an electrical consumer by an electrical energy source in a motor vehicle, a current sensor can be connected in series between the electrical energy source and the electrical consumer. Such a current sensor is known, for example, from DE 10 2011 078 548 A1, is incorporated by reference.

Current sensors need to be connected in series between the electrical energy source and the electrical consumers.

SUMMARY OF THE INVENTION

An aspect of the present invention consists in improving this connection of the current sensors in series between the energy source and the consumer.

This is achieved by the features of the independent claims. Preferred developments are the subject matter of the dependent claims.

The invention proposes a circuit for conducting an electric current between a vehicle battery and an electrical network component which can be connected to the vehicle battery via an electrical element, which comprises a first electrical line section and a second line section, which is separated from the first line section via a spacer, wherein the line sections are connected to one another via the electrical element.

In the context of the invention, the electrical element can be any desired element which can be connected between the vehicle battery and the electrical network component. Thus, the electrical element can be, for example, the current sensor mentioned at the outset, a filter for improving electromagnetic compatibility (referred to as EMC), a protective diode and/or a temperature sensor, which monitors the ambient temperature for the protection of other electrical elements. In this case, the current sensor can be used for current measurement, charge current regulation, current rise limitation or as a current switch. The current sensor and the corresponding applications can be implemented unidirectionally or bidirectionally.

In the same way, the electrical network component, beside the vehicle battery, can be any desired electrical element such as an electrical energy source in the form of a generator, a socket outlet or another battery or an electrical consumer, such as, for example, a vehicle electrical distribution system or an electric motor.

The cited circuit is based on the consideration that the electrical element could be connected directly between the vehicle battery and the electrical network component. However, this consideration is based on the knowledge that the electrical connection would at the same time also have to take on the mechanical strength between the vehicle battery and the electrical network component. Therefore, with the cited circuit, it is proposed to make electrical contact with the electrical element between the vehicle battery and the other electrical network component via line sections, which are kept at a predefined distance from one another via a spacer. In this way, mechanical loads which are introduced, for example, as a result of heat work, vibrations or other mechanical disturbances onto the circuit can be absorbed by the spacer, with the result that the electrical connection between the line sections and the electrical element is protected against mechanical loads and therefore against mechanical stresses.

By virtue of the cited circuit, the electrical element is electrically connected between the vehicle battery and the other electrical network component permanently and continuously, as a result of which the electrical connection of the vehicle battery and the other electrical network component can be made more reliable.

In a development of the cited circuit, the line sections are interlocked with one another in labyrinth-like fashion. With this development of the cited circuit, the line sections are interleaved with one another in order to achieve a fixed mechanical coupling of the line sections via the spacer and a low level of thermal expansion of the connecting zones between the line sections, which is produced as a result of the now very thin line sections.

In an additional development of the cited circuit, the labyrinth-like interlocking of the line sections is resilient. In this way, the line sections can absorb a remaining proportion of mechanical loads themselves and thus avoid a situation whereby the electrical contact-making points of the electrical element with which electrical contact is to be made via the line sections are also mechanically loaded outside the labyrinth-like interlocking.

In another development of the cited circuit, the spacer is formed from a premold material. A premold material is understood to mean a material which, in a melted state of aggregation, is inserted between the two line sections and then cures between the two line sections. Such premold materials can be, for example, thermosetting plastics and thermoplastics. The premold material makes it possible for the spacer to be formed with very precise dimensions, with the result that the spacer does not brace the two line sections mechanically against one another unnecessarily in a state free of mechanical loads between the two line sections.

In a preferred development of the cited circuit, the premold material envelops a surface of the electrical line sections in such a way that an opening for making electrical contact with the electrical element remains free on the line sections. In this way, further improved mechanical fixing of the electrical line sections and therefore a zone which is even more free of mechanical stresses can be provided for the electrical element and its electrical connection to the electrical line sections.

In another development of the cited circuit, a distance between the first line section and the second line section is dependent on a breakdown field strength of the spacer. The dependence is in particular in this case designed in such a way that the lower the breakdown field strength of the spacer, the greater the distance. Particularly preferably, in this case the distance is selected to be large enough for it to be possible for no electrical flashover to occur between the line sections.

The line sections can consist of copper, aluminum, iron, nickel and alloys thereof. Ostensibly, the temperature coefficient and the thermal conductivity are important in the choice.

In yet another development of the cited circuit, the contact areas on the line sections for making contact with the electrical element are coated. Coating materials which can be selected can include metals or metal alloys used to assist in the electrical contact-making of the electrical element to the corresponding line section. Such metals or metal alloys can be alloys which are based on copper or a mixture of copper and nickel, such as Cu—Ni—SN, Cu—Sn, Cu—Ni—Au, Cu—Ni—Pd—Au or Cu—Ag. The contact areas on the electrical line sections can in this case be cleaned prior to the electrical contact-making, in particular with $CO_2$ by means of irradiation, with plasma or with a laser. For the contact-making itself, the electrical elements can be applied to the electrical line sections by means of sintering, adhesive bonding or soldering.

In a preferred development of the cited circuit, the cited circuit comprises the electrical element, which is covered by a protective compound. The protective compound, which can also be in the form of glob-top or silicone gel, protects and insulates the electrical element permanently, in particular against moisture and impurities which could result in electrical malfunctioning of the electrical element.

In a particularly preferred development of the cited circuit, the line sections are mounted on a component part mount, referred to as leadframe. A plurality of circuits can be mounted simultaneously on this leadframe and can therefore be mass-produced, wherein the individual circuits ultimately then only need to be separated from one another by being severed.

An aspect of the invention also specifies a vehicle which comprises
a vehicle battery,
an electrical network component which is connected to the vehicle battery, and
one of the cited circuits, which is connected between the vehicle battery and the electrical network component.

An aspect of the invention also specifies a method for producing a circuit for conducting an electric current between a vehicle battery and an electrical network component which can be connected to the vehicle battery via an electrical element, which comprises the steps of arranging a first electrical line section and a second electrical line section with a gap with respect to one another, introducing a spacer into the gap, and bridging the gap having the spacer with an electrical element, with the result that the electrical element electrically connects the first and second line sections to one another.

The cited production method can be extended by production method steps which analogously realize the features of the cited circuit in accordance with the dependent claims.

The above-described properties, features and advantages of this invention and the way in which these properties, features and advantages are achieved will become clearer and more easily understandable in connection with the description below relating to the exemplary embodiments which are explained in more detail in connection with the drawings, in which:

DETAILED DESCRIPTION

Identical technical elements are provided with the same reference symbols in the figures and are only described once.

Figure 1:
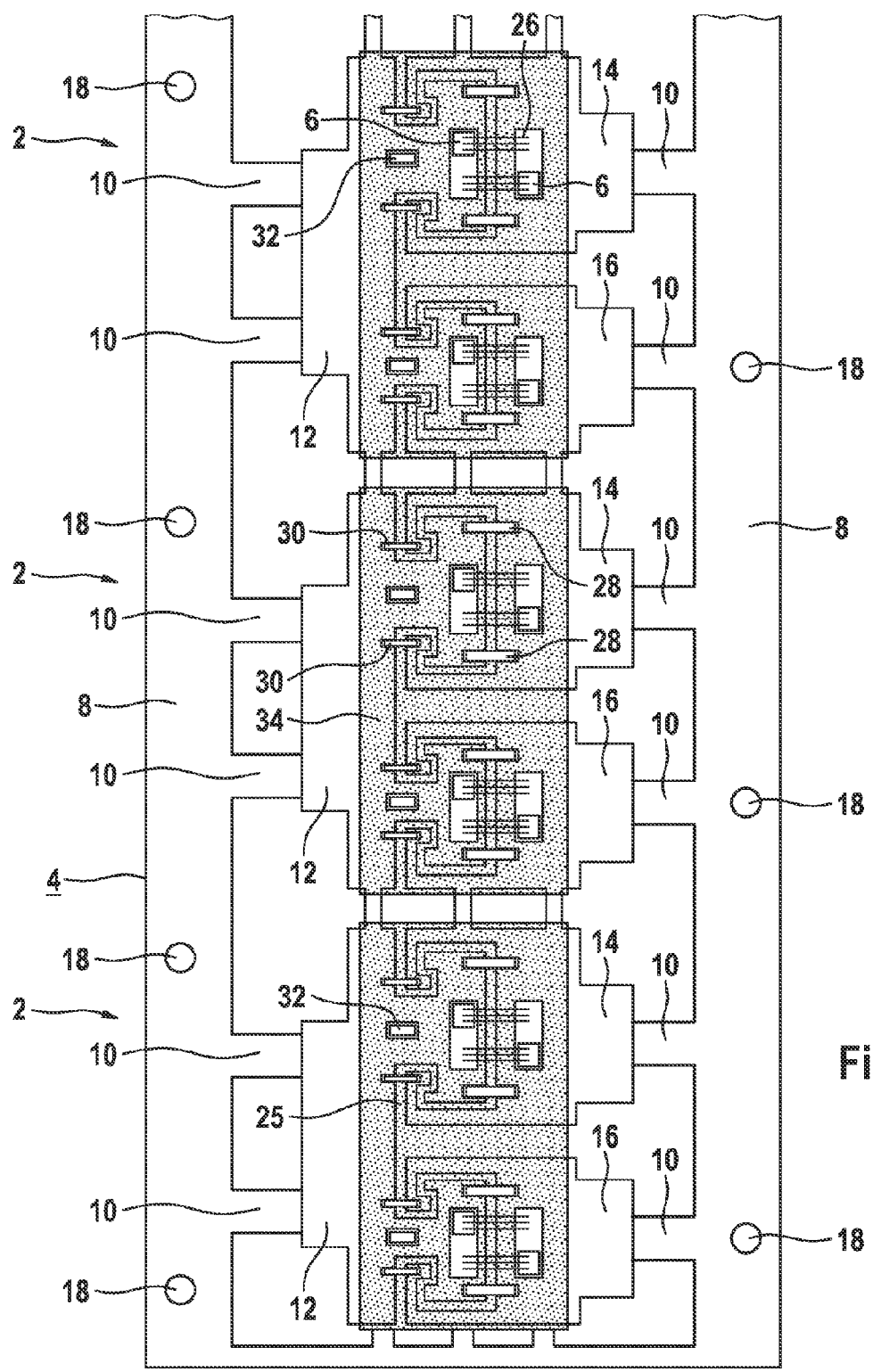
FIG. 1 shows a schematic view of circuits which are mounted on a leadframe.

Reference is hereby made to FIG. 1, which shows a schematic view of circuits 2 which are mounted on a leadframe 4.

In the present embodiment, the circuits 2 are intended to be used for current sensors 6, yet to be described, which can be connected in series between a vehicle battery (not illustrated in any more detail) and an electrical consumer (not illustrated in any more detail) or between the vehicle battery and an electrical connection (not illustrated in any more detail) for charging the vehicle battery. In FIG. 1, only some of the current sensors 6 have been provided with a reference symbol, for reasons of clarity. The current sensors 6 are intended to measure the current output by the vehicle battery or the current feeding the vehicle battery, on the basis of which a state of charge of the vehicle battery can be detected, which state of charge can in turn be used for energy management of the vehicle battery.

In the present embodiment, the leadframe 4 has two main rails 8, from which electrical busbars 10, also referred to as webs 10, protrude at right angles, wherein contact is made between said electrical busbars and electrical connections 12, 14, 16 (yet to be described) of the circuits 2. Index holes 18 are formed on the main rails 8, with it being possible to detect the longitudinal dimensions of the circuits 2 by measurement technology using said index holes in order to transport and separate the circuits 2 in automated fashion.

In FIG. 1, each circuit has three line sections 20, 22, 24, which are mechanically and electrically isolated from one another by an electrically insulating gap 25. In FIG. 1, only the gap 25 of a circuit 2 has been provided with a reference symbol, for reasons of clarity. In this case, one of the electrical connections 12, 14, 16 is formed at each line section 20, 22, 24. In the present embodiment, a first of the electrical connections 12 is intended to be connected to the abovementioned vehicle battery, with the result that the first connection 12 will be referred to below as battery connection 12. A second of the electrical connections 14 is intended to be connected to the abovementioned electrical consumer, with the result that the second connection 14 will be referred to below as consumer connection 14. A third of the connections 16 is intended to be connected to the abovementioned electrical connection, with the result that the third connection 16 will be referred to below as electrical connection 16. The line sections 20, 22, 24 on which the battery, consumer and electrical connections 12, 14, 16 are formed correspondingly will also be referred to below using corresponding nomenclature.

Hereinafter, two current sensors 6 on each circuit 2 bridge two of the line sections 20, 22, 24, with the result that an electrical current can flow either between the battery connection 12 and the consumer connection 14 or between the battery connection 12 and the electrical connection 16. In this way, a vehicle battery connected to the battery connection 12 can be discharged and possibly charged via the consumer connection 14 and charged and possibly discharged via the electrical connection 16.

In the present embodiment, the current sensors 6 are mounted on one of the line sections 20, 22, 24 and electrical contact is also made between said current sensors and said line section and between said current sensors and the respective further line section 20, 22, 24 via a bond 26. In FIG. 1, only one of the bonds 26 has been provided with a reference symbol, for reasons of clarity. The current sensors 6 can have any desired design, but the current sensors 6 are particularly preferably in the form of active shunts, which are known from DE 10 2011 078 548 A1. For reasons of brevity, reference is made to this document for further details regarding these active shunts.

Furthermore, the line sections 20, 22, 24 can also connect EMC and ESD capacitors 28 and protective switching elements 30, which can be in the form of, for example, a protective diode, a protective capacitor or a protective varistor. The EMC capacitors are used for filtering undesired signal components from the current to be conducted and thus improve electromagnetic compatibility and resistance to electrostatic discharges. In FIG. 1, only some of the EMC capacitors 28 and the protective switching elements 30 have been provided with a reference symbol, for reasons of clarity.

Finally, temperature sensors 32 which can be provided for detecting a temperature of the circuit 2 in order to introduce suitable protective measures in the event of overheating of the circuit 2 can be arranged on the battery line section 12 and/or one of the other line sections 14, 16. In FIG. 1 only some of the temperature sensors have been provided with a reference symbol, for reasons of clarity. In addition to this monitoring function, the temperature sensors can also be used for characteristic correction of the electrical elements, such as, for example, field-effect transistors contained in the current sensors 6.

The above-described gap 25 is thus necessary for current measurement, for increasing electromagnetic compatibility (EMC) and resistance to electrostatic discharges (ESD) and for implementing the protective switching elements 30. It therefore needs to be ensured that the individual line sections 12, 14, 16 do not have any electrical contact with one another.

On the other hand, the individual line sections 20, 22, 24 also require a certain mechanical hold with respect to one another, however. Otherwise, the bonding wires 26, the EMC capacitors 28 and the protective switching elements 30 would be subjected to excessively severe mechanical tensile loading, which could release the electrical contact between these elements or damage the elements themselves and could thus render the circuit 2 inoperative. In addition, the line sections 20, 22, 24 themselves can also be stressed and transfer these stresses to the electrical elements which are mounted on said line sections, such as the current sensors 6 and the temperature sensors 32, which in this case could also result in release of the electrical contact-making or damage to the elements themselves.

In order to circumvent these disadvantages, in the present embodiment it is therefore proposed to interlock the line sections 20, 22, 24 with one another in labyrinth-like fashion and to embed said line sections in a premold compound 34, with the result that the premold compound 34 holds together the individual line sections 20, 22, 24 in an inflexible manner.

This will be explained in more detail below with reference to FIG. 2, which shows a schematic view of one of the circuits 2 shown in FIG. 1 without population with elements, such as the current sensors 6, the bonding wires 26, the EMC capacitors 28 and the protective switching elements 30 and the temperature sensors 32.

Figure 2:
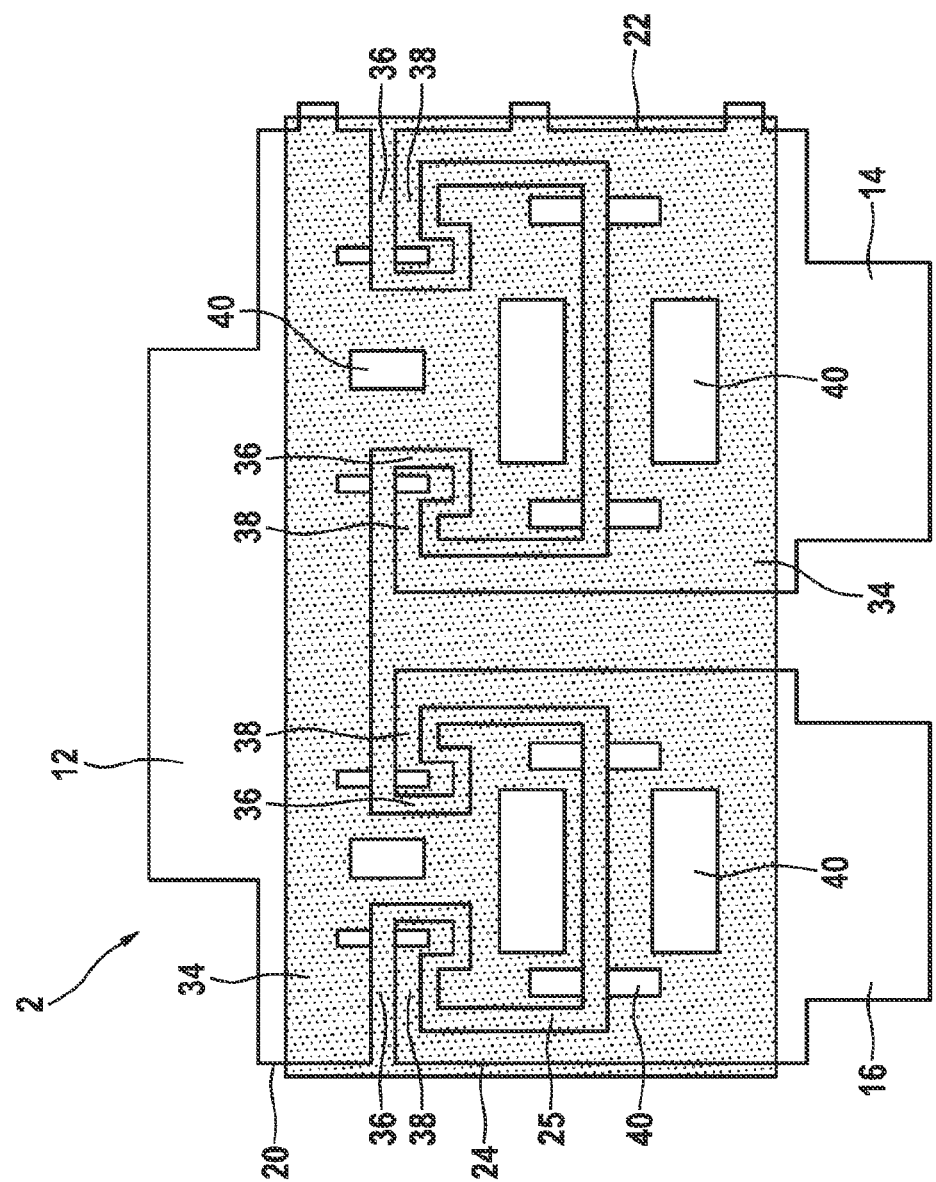
FIG. 2 shows a schematic view of one of the circuits shown in FIG. 1.

As can be seen from FIG. 2, the battery line section 20 has labyrinths 36, into which the arms 38 engage, which arms are formed correspondingly on the consumer line section 22 and on the current line section 24. The arms 38 in this case have the same labyrinth-shaped profile as the labyrinth 36, but are narrower, with the result that the electrically insulating gap 25 remains between the line sections 20, 22, 24. By virtue of the arms 38 engaging in the labyrinths 36, the line sections 20, 22, 24 are interlocked and therefore interleaved in labyrinth-shaped fashion.

In order to maintain the mechanical stability between the line sections 20, 22, 24, at least the gap 25 is cast with the premold compound 34. In the present embodiment, however, all of the line sections 20, 22, 24 are coated with the premold compound 34, wherein openings 40 remain into which the electrical elements mentioned above and shown in FIG. 1 are inserted and can be brought into contact with the line sections 20, 22, 24. This will be discussed in more detail at a later juncture. In FIG. 2, only some of the openings 40 have been provided with a reference symbol, for reasons of clarity.

If, in the design shown in FIG. 2, two of the line sections 20, 22, 24 are subjected to tensile or compressive loading with respect to one another, this results in the material of the premold compound 34 in the gap 25 being compressed at one point, while it is spread out at another point. In this way, two different counterforces applied by the premold compound 34 act counter to the tensile or compressive loading, as a result of which the line sections 20, 22, 24 are held in mechanically fixed fashion in relation to one another at their relative positions.

As a result of the fact that the premold compound 34 additionally also extends over the surface of the line sections 20, 22, 24, the line sections 20, 22, 24 are prevented from rotating inwards, resulting in surface tensions which could then be transferred to the abovementioned elements. Thus, an electrically and mechanically stable circuit 2 is provided which also meets very high demands in terms of reliability, as are expected in automotive engineering, for example.

Figure 3:
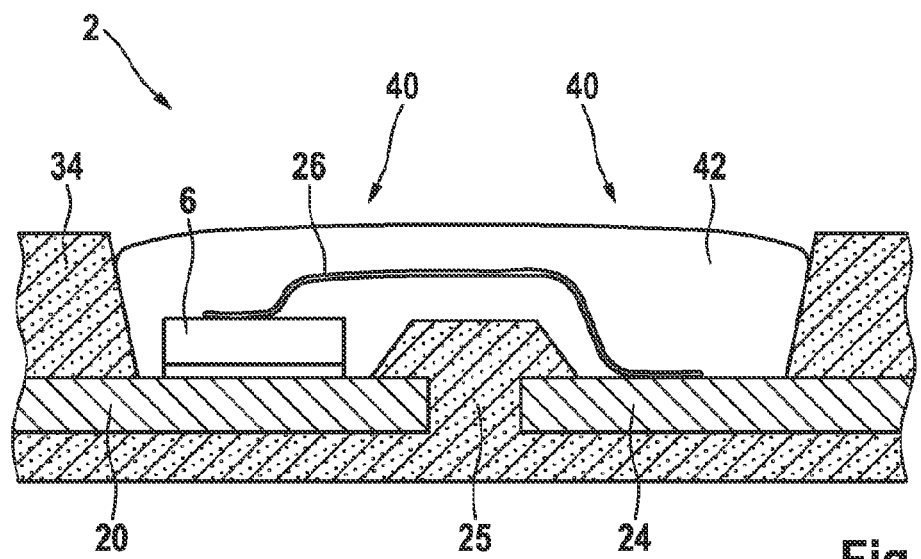
FIG. 3 shows a schematic sectional view of part of the circuit shown in FIG. 2.

Reference is made to FIG. 3, which shows a schematic sectional view of part of the circuit 2 shown in FIG. 2.

FIG. 3 shows part of the battery line section 12 and the current line section 24, which are electrically isolated by the gap 25, wherein the gap 25 is bridged electrically via the current sensor 6 and the bond 26, with the result that an electrical current can flow between the two line sections 20, 24 via the current sensor 6.

In the present embodiment, the current sensor 6 and the bonds 26 are surrounded by a protective compound 42 consisting of a glob-top or silicone gel material, which protective compound protects the current sensor 6 and the bonds 26 from the ingress of moisture and other impurities.

The line sections 20, 22, 24 can be encapsulated by injection molding with the premold material 34, for example, with the result that some of the premold material 34 passes through the gap 25. Therefore, a relatively small accumulation of premold material 34 is located beneath the bond 26 in the region of the gap 25, and this accumulation provides additional anchoring for the line sections 20, 22, 24 in the premold compound 34.

Figure 4:
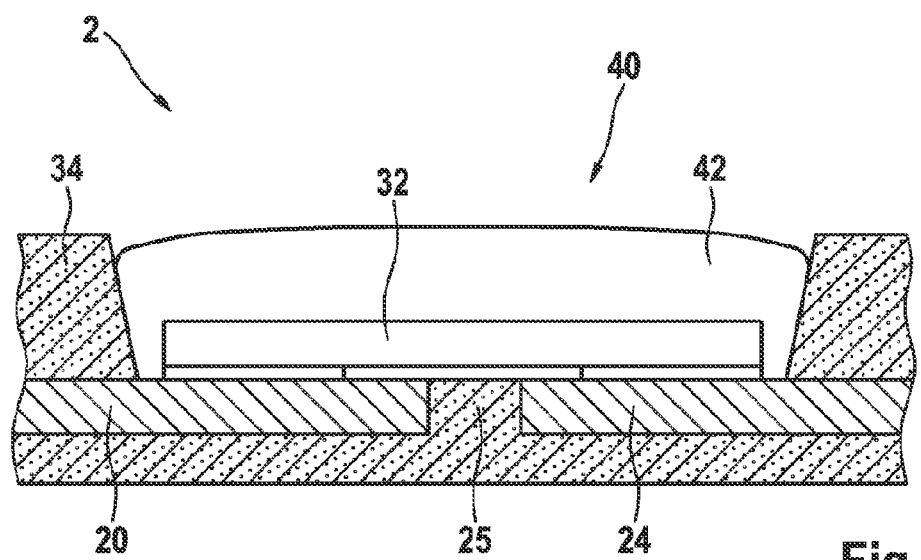
FIG. 4 shows a schematic sectional view of part of the circuit shown in FIG. 2.

Reference is made to FIG. 4, which shows a schematic sectional view of part of the circuit shown in FIG. 2, in which electrical contact is made with a protective switching element 32 between the battery line section 12 and the current line section 16.

As can be seen in FIG. 4, in the present embodiment, electrical contact is made directly between the protective switching element 32 and the line sections 20, 24 without a further bond. Therefore, it is necessary to ensure that there is no accumulation of premold material 34 beneath the protective switching element 32. This can be ensured either by virtue of the fact that the gap is covered during encapsulation by injection molding of the line sections 20, 24 in the opening 40 or the premold material 34 is removed after encapsulation by injection molding of the line sections 20, 24 in the opening 40.

Figure 5:
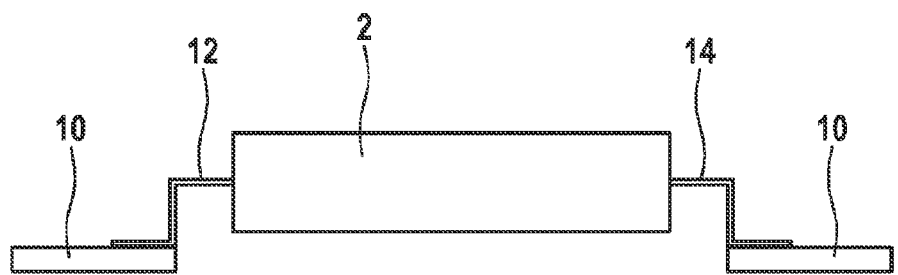
FIG. 5 shows a side view of the circuit shown in FIG. 2.

Reference is made to FIG. 5, which shows a side view of the circuit 2 shown in FIG. 2 encapsulated by injection molding with the premold material 34, wherein the electrical busbars 10 shown in FIG. 1 are electrically connected to the circuit 2.

As can be seen in FIG. 5, the connections 12, 14, 16, of which the battery connection 12 and the consumer connection 14 are shown by way of example in FIG. 5, can be bent back. In this way, the connections 12, 14, 16 can extend mechanically at an angle to the circuit 2, with the result that the connections do not introduce any mechanical loads, for example as a result of thermal expansion, into the circuit 2.

Figure 6:
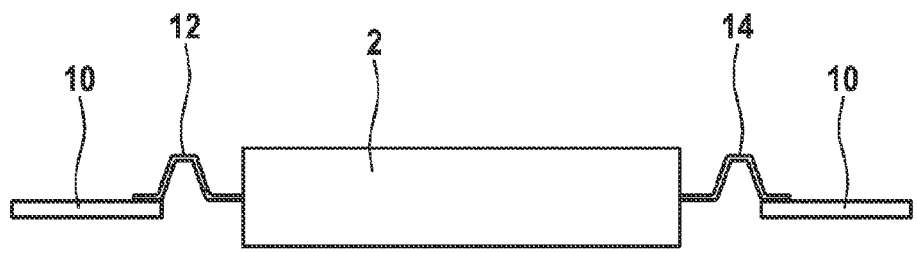
FIG. 6 shows an alternative side view of the circuit shown in FIG. 2.

FIG. 6 shows an alternative example for the design of the connections 12, 14, 16 so as to permit mechanical expansion at right angles to the circuit 2. In FIG. 6, the connections 12, 14, 16 are folded, as a result of which the connections can be pushed together and can thus themselves absorb mechanical expansions in the direction of the circuit 2.

The invention claimed is:

1. A circuit for conducting an electric current between a vehicle battery and an electrical network component, the circuit comprising:
    a first electrical line section;
    a second electrical line section connected to the first electrical line section via an electrical element; and
    a spacer separating the second electrical line section from the first electrical line section,
    wherein the first electrical line section and the second electrical line section are interlocked with one another on a first axis and on a second axis in a labyrinth to impede movement between the first electrical line section and the second electrical line section in the first axis and the second axis.

2. The circuit as claimed in claim 1, wherein the labyrinth interlocking of the electrical line sections is resilient.

3. The circuit as claimed in claim 1, wherein the spacer is a premold material.

4. The circuit as claimed in claim 3, wherein the premold material envelops a surface of the electrical line sections in such a way that an opening for making electrical contact with the electrical element remains free on the electrical line sections.

5. The circuit as claimed in claim 1, wherein a distance between the first electrical line section and the second electrical line section is dependent on a breakdown field strength of the spacer.

6. The circuit as claimed in claim 1, wherein contact areas on the electrical line sections for making contact with the electrical element are coated.

7. The circuit as claimed in claim 1, comprising the electrical element, which is covered by a protective compound.

8. The circuit as claimed in claim 1, wherein the electrical line sections are mounted on a component part mount, referred to as leadframe.

9. A method for producing a circuit for conducting an electric current between a vehicle battery and an electrical network component which can be connected to the vehicle battery via an electrical element, comprising:
    arranging a first electrical line section and a second electrical line section with a gap separating the first electrical line section from the second electrical line section,
    introducing a spacer into the gap, and
    bridging the gap having the spacer with the electrical element, with the result that the electrical element electrically connects the first and second electrical line sections to one another,
    wherein the first electrical line section and the second electrical line section are interlocked with one another on a first axis and on a second axis in a labyrinth to impede movement between the first electrical line section and the second electrical line section in the first axis and the second axis.

* * * * *